US010670405B2

(12) United States Patent
    Felice

(10) Patent No.: US 10,670,405 B2
(45) Date of Patent: Jun. 2, 2020

(54) INERTIAL MEASUREMENT UNIT MANAGEMENT WITH REDUCED ROTATIONAL DRIFT

(71) Applicant: Immersion Services, LLC, Renton, WA (US)

(72) Inventor: Michael Felice, Seattle, WA (US)

(73) Assignee: IMMERSION NETWORKS, INC., Renton, WA (US)

(*) Notice: Subject to any disclaimer, the term of this patent is extended or adjusted under 35 U.S.C. 154(b) by 0 days.

(21) Appl. No.: 16/144,087

(22) Filed: Sep. 27, 2018

(65) Prior Publication Data
    US 2019/0204083 A1    Jul. 4, 2019

Related U.S. Application Data

(60) Provisional application No. 62/612,595, filed on Dec. 31, 2017.

(51) Int. Cl.
    *G01C 21/18* (2006.01)
    *G01C 21/06* (2006.01)
    (Continued)

(52) U.S. Cl.
    CPC ............ *G01C 21/18* (2013.01); *G01C 21/06* (2013.01); *G01C 25/00* (2013.01); *G01R 33/0035* (2013.01)

(58) Field of Classification Search
    CPC ...................................................... G01C 21/06
    See application file for complete search history.

(56) References Cited

U.S. PATENT DOCUMENTS 5,841,537 A    11/1998  Doty
6,480,152 B2   11/2002  Lin et al.
               (Continued)

FOREIGN PATENT DOCUMENTS

CA    1149201      7/1983
EP    2239539     10/2010
WO    94/16504    7/1994

OTHER PUBLICATIONS

Notification of Transmittal of the International Search Report and Written Opinion from the International Searching Authority—The European Patent Office—for International Application No. PCT/US2018/053086, dated Jan. 4, 2019, 15 pages.
(Continued)

*Primary Examiner* — Daniel S Larkin
(74) *Attorney, Agent, or Firm* — Jackson Walker LLP; Christopher J. Rourk

(57) ABSTRACT

A system, comprising a clock generating a timing signal, a magnetometer coupled to the clock and configured to receive the timing signal and to generate first heading data and a gyroscope coupled to the clock and configured to receive the timing signal and to generate second heading data. The system further includes a first adder coupled to the magnetometer and gyroscope and configured to determine a difference signal as a function of the first heading data and the second heading data and a constrain data system coupled to the first adder and configured to apply a limit to the difference signal. A combine delta system is coupled to the constrain data system and configured to combine two or more of the constrained data values to generate a combined delta signal, and a second adder coupled to the gyroscope and the combine delta system and configured to add the combined delta signal to the second heading data.

20 Claims, 12 Drawing Sheets

(51) Int. Cl.
    *G01R 33/00*     (2006.01)
    *G01C 25/00*     (2006.01)

(56) References Cited

U.S. PATENT DOCUMENTS

| | | |
|---|---|---|
| 9,170,124 B2 | 10/2015 | Keene et al. |
| 2009/0326851 A1 | 12/2009 | Tanenhaus |
| 2010/0114329 A1 | 5/2010 | Casler et al. |
| 2014/0270743 A1 | 9/2014 | Webb et al. |
| 2016/0047675 A1 | 2/2016 | Tanenhaus et al. |
| 2017/0241783 A1 | 8/2017 | Askarpour et al. |

OTHER PUBLICATIONS

Notification of Transmittal of the International Preliminary Report on Patentability dated Sep. 16, 2019 from the International Preliminary Examining Authority—The United States Patent & Trademark Office—for International Application No. PCT/US2018/053086, 17 pages.

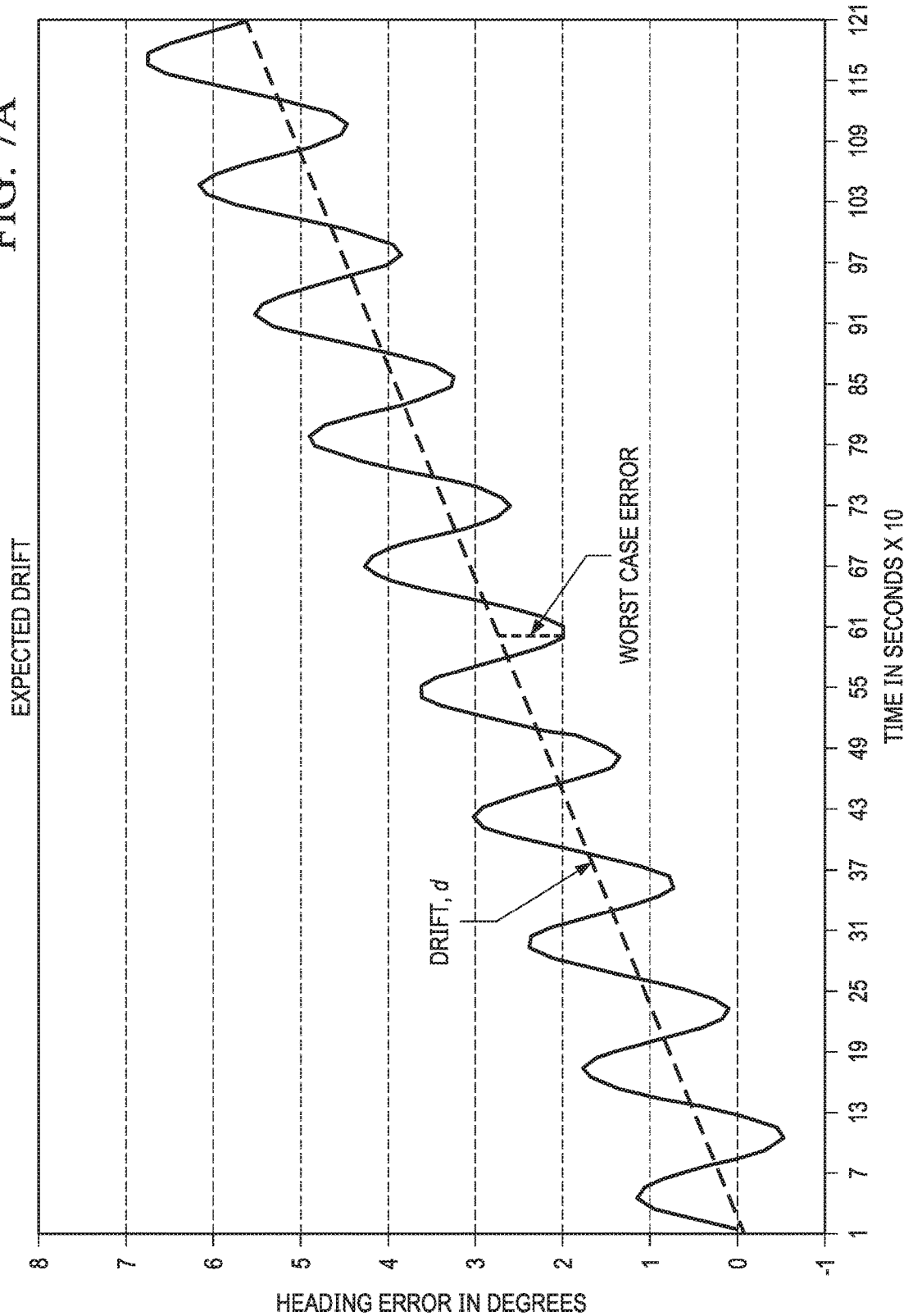

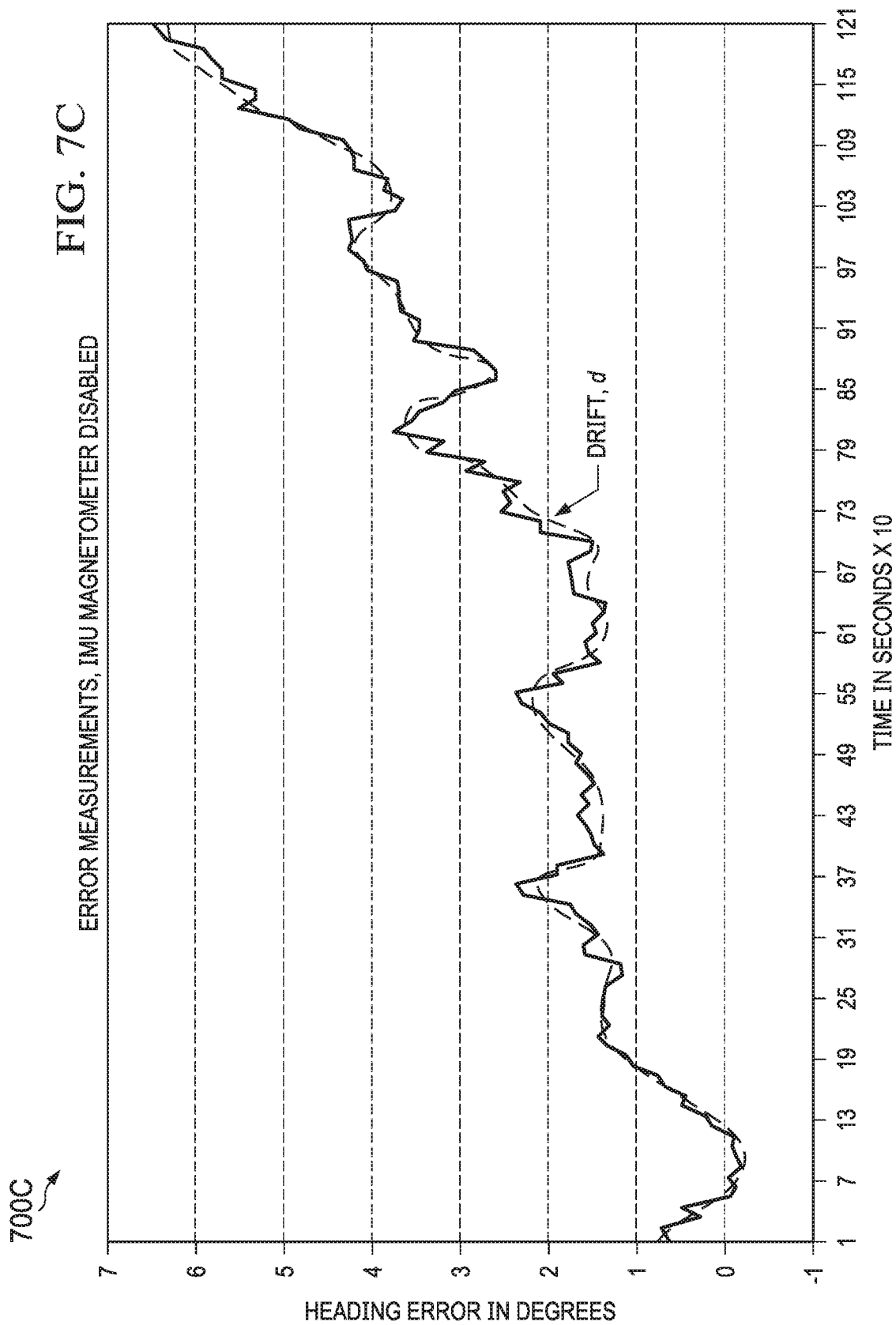

INERTIAL MEASUREMENT UNIT MANAGEMENT WITH REDUCED ROTATIONAL DRIFT

RELATED APPLICATIONS

The present application claims benefit to U.S. Provisional Patent Application No. 62/612,595, filed Dec. 31, 2017, which is hereby incorporated by reference for all purposes, as if set forth herein in its entirety.

TECHNICAL FIELD

The present disclosure relates generally to the field of inertial measurement units (IMUs), and more specifically to IMUs configured to exhibit less rotational drift than conventional IMUs, and methods of managing IMUs to yield output signals with less rotational drift than conventional IMUs.

BACKGROUND OF THE INVENTION

An IMU can be a self-contained system of sensors used to discern relative positional and rotational changes to the system. Because the measurements are relative, errors generated by the sensors accumulate, reducing the reliability of readings over long-term use.

SUMMARY OF THE INVENTION

A system, comprising a clock generating a timing signal, a magnetometer coupled to the clock and configured to receive the timing signal and to generate first heading data and a gyroscope coupled to the clock and configured to receive the timing signal and to generate second heading data. The system further includes a first adder coupled to the magnetometer and gyroscope and configured to determine a difference signal as a function of the first heading data and the second heading data and a constrain data system coupled to the first adder and configured to apply a limit to the difference signal. A combine delta system is coupled to the constrain data system and configured to combine two or more of the constrained data values to generate a combined delta signal, and a second adder coupled to the gyroscope and the combine delta system and configured to add the combined delta signal to the second heading data.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE SEVERAL VIEWS OF THE DRAWINGS

Aspects of the disclosure can be better understood with reference to the following drawings. The components in the drawings may be to scale, but emphasis is placed upon clearly illustrating the principles of the present disclosure. Moreover, in the drawings, like reference numerals designate corresponding parts throughout the several views, and in which:

FIGS. 7A through 7D are graphs demonstrating the principles of the present disclosure.

DETAILED DESCRIPTION OF THE INVENTION

Figure 1:
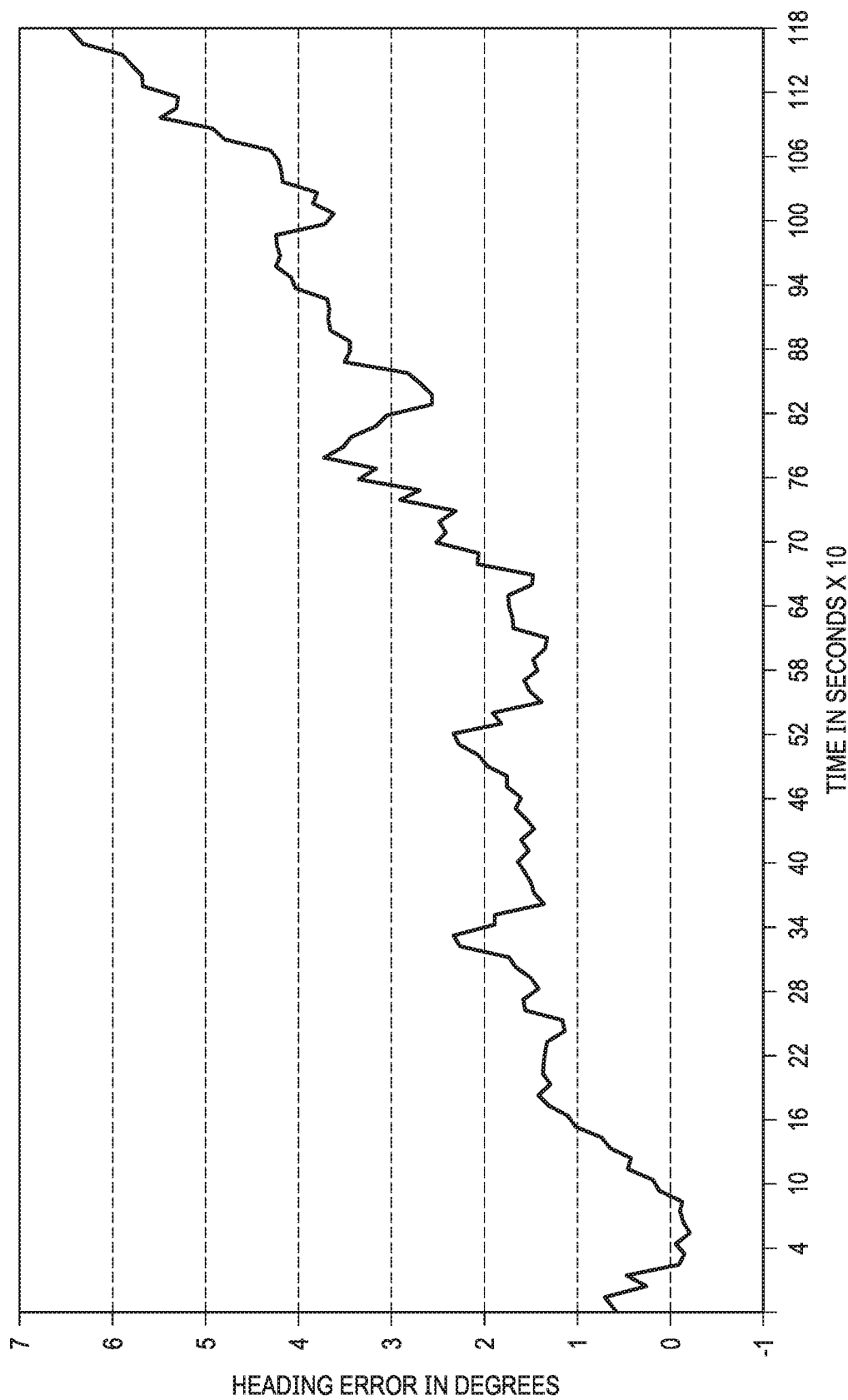
FIG. 1 is a graph showing sensor heading error measured in ten second intervals by subtracting a known heading angle from an IMU measurements, in accordance with the present disclosure.

In the description that follows, like parts are marked throughout the specification and drawings with the same reference numerals. The drawing figures may be to scale and certain components can be shown in generalized or schematic form and identified by commercial designations in the interest of clarity and conciseness.

The time-dependent error of an IMU may be referred to as drift. The present disclosure can be used to eliminate drift, such as by processing the output of the IMU sensors to prevent drift or in other suitable manners.

An IMU can be constructed with one or more sensors, such as accelerometers, gyroscopes, and magnetometers, and each type of sensor measures different external forces on the IMU. An accelerometer measures normal forces relative to the axes that the sensor is aligned with, namely, the three orthogonal axes for translation up/down, left/right and forward/backward movement. The normal forces are accelerations that can be mathematically integrated to compute velocities and integrated again to determine positional changes over time. When the accelerometer is stationary, it can accurately describe the force of gravity on the system when that is the only external force acting on the sensor.

A gyroscope measures rotational changes relative to the axes that the sensor is aligned with. If the gyroscope measures angular velocity, that can be integrated to determine angular changes over time. The orientation of the IMU in relation to a device that it is incorporated into can be used to determine the facing direction (heading) of the device, based on the heading of the IMU.

A magnetometer measures magnetic fields. In an unshielded open space, it is possible to measure the Earth's magnetic field, which allows a magnetometer to be used to find a reference direction, like a compass does. When external magnetic fields are not changing, the magnetometer's readings can be used to correct rotational measurements from drifting, because the source direction (such as magnetic north) does not significantly change in the absence of significant changes in location.

In accordance with the present disclosure, an IMU's sensors measurements can be processed with "fusion software" to perform the mathematical integration needed to get meaningful positional and angular information about the system's orientation changes and also to reduce error.

A number of different factors can destabilize a magnetometer's readings and result in magnetometer error or drift. For example, the magnetic field of the earth can be disrupted in a local zone around the magnetometer by ferrous materials, metal, electrical circuits or other independent magnetic fields, which can skew the magnetometer's identification of magnetic north. In addition, the location of magnetic north is dependent on the location of the device that is measuring magnetic north, so there is no way to calibrate a magnetometer by itself to help identify magnetic north for internationally produced IMUs. As such, an IMU can use data from the gyroscope to determine rotational changes, and the magnetometer can be used to help reduce drift in fusion software, for a compass application or for other suitable purposes.

To compensate for magnetic field disruptions and long-distance travel, a magnetometer can use dynamic calibration to recalibrate itself as it reads magnetic field measurements. Dynamic calibration of a magnetometer of an IMU can be performed by manually rotating the IMU around three orthogonal axes. However, movement often degrades magnetometer calibration over time due to changing magnetic fields, and the manual process can also be cumbersome, such that the magnetometer might not be well calibrated, especially over long-term use.

FIG. 1 is a graph 100 showing sensor heading error measured in ten second intervals by subtracting a known heading angle from an IMU's measurements, in accordance with the present disclosure. For short-term results, disabling the magnetometer such that only accelerometers and/or gyroscopes are engaged can reduce an initial heading error, but as shown in graph 100, drift can become significant over time. Graph 100 was generated by stationing an IMU on a mechanically rotating device, and taking measurements over the course of twenty minutes to demonstrate this previously unidentified problem with such devices. It can be seen that the error grows larger as time continues. Note that drift can change in either direction, so the curve might or might not correct itself or overshoot in the opposite direction over time.

Figure 2:
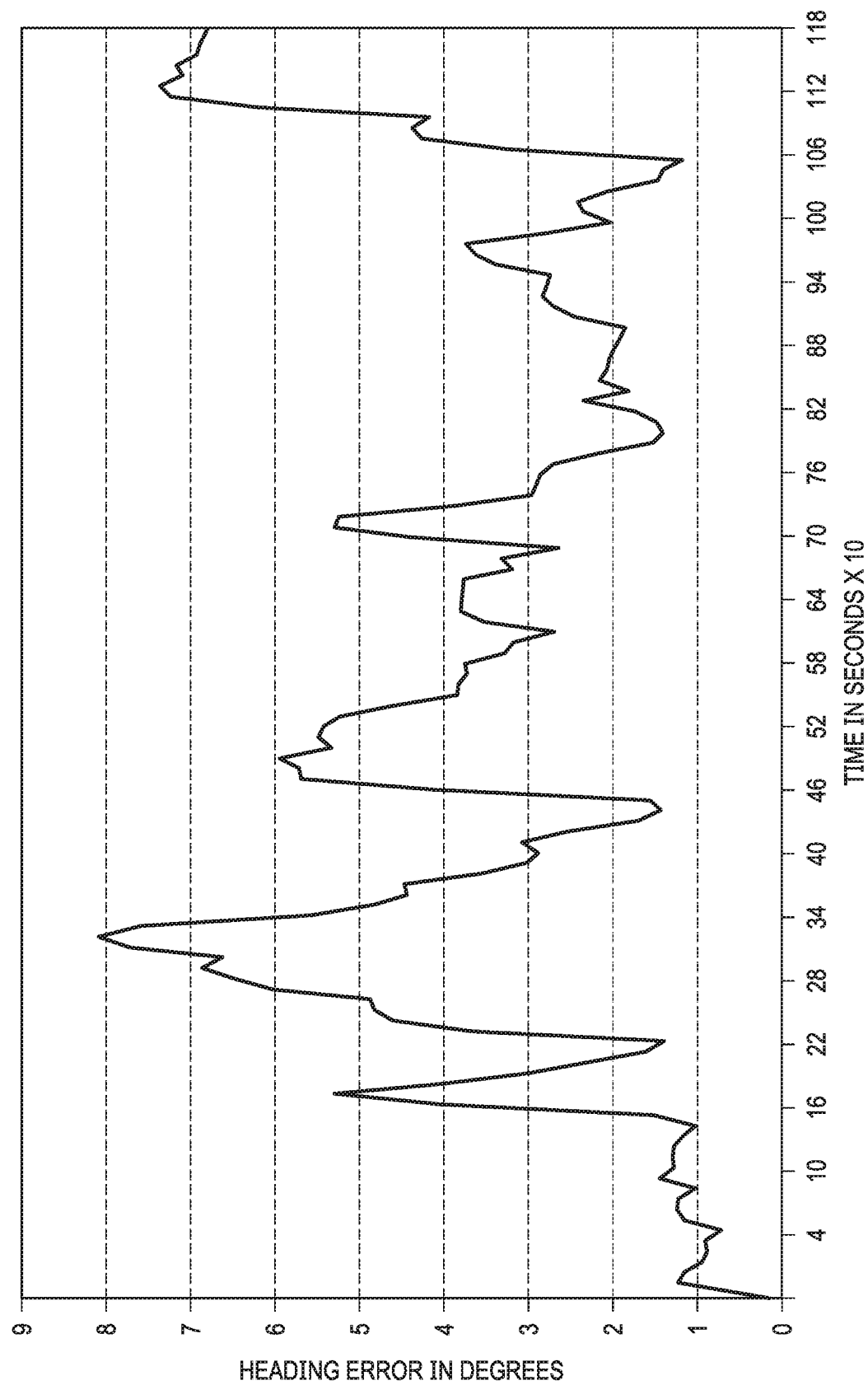
FIG. 2 is a graph showing sensor heading error with a magnetometer, in accordance with the present disclosure.

FIG. 2 is a graph 200 showing sensor heading error with a magnetometer, in accordance with the present disclosure. Graph 200 is shown on the same scale as graph 100. The magnetometer can be used to maintain IMU calibration within manufacturer specifications over the course of twenty minutes. By enabling the magnetometer, drift can be removed entirely (for practical purposes) if the magnetometer is well calibrated. For example, as shown in graph 200, there is no drift because the heading error does not increase over time. However, the error shown in graph 200 is large, ranging from 1° to 8°. If the magnetometer calibration is not maintained, the error range can increase more. While magnetometers can be used in an IMU to remove drift, they can also introduce unpredictable error signals into the system, resulting in an unreliable solution, especially when frequent, manual dynamic calibration is not required.

It is noted that the IMU used to generate graphs 100 and 200 was rotated only (not translated) when gathering the data for those graphs, because movement influences the magnetic field measurements. An IMU that is moving while also rotating can provide worse magnetometer results than one that is only rotated. To facilitate comparisons, graphs 100 and 200 were generated from rotation-only tests, but the present disclosure also provides benefits for an IMU that is undergoing simultaneous rotation and translation.

A number of steps can be used to try to mitigate the drift of IMU readings. For example, improving magnetometer, gyroscope, and accelerometer accuracy directly reduces the measurement errors reported by the IMU, and reduces drift error. Incorporating a very accurate, sensitive clock in the IMU can also reduce error in the fusion software calculations, especially when integrating sensor output to get positional and angular changes in orientation. Constraining systems in which the IMU is used can also help to identify and eliminate error. For example, if it is known that an IMU is used for car navigation, gyroscope-magnetometer readings can be corrected or removed when the IMU reports that the car is turning sharper than its known turning capability. Motion-based alignment can also assist when the direction of IMU travel is used to influence heading. For example, a plane traveling at high speed is assumed to be traveling forward, which is the same as the heading direction for the vehicle. This technique can be used to eliminate drift as long as orientation can be determined from motion. Adding more sensors to help determine positional and rotational awareness can also help to eliminate error. For example, an IMU used in a navigation unit can be accompanied with a GPS for more accurate positioning. An IMU can also be accompanied with depth sensors and cameras to try to pinpoint the position and rotation of an object in space. Fusion software can also reduce error through data processing techniques and filters. IMU calibration techniques can also affect drift error, and IMU producers maintain many IMU calibration techniques as trade secrets to gain competitive advantages over other IMU manufacturers.

However, even with these efforts, drift in rotational signals from IMUs remains a problem in many applications. There is a need for IMUs configured to produce rotational signals with lower drift, and for new systems and methods of managing IMUs to produce rotational signals with lower drift, such as those disclosed herein.

Embodiments of the present disclosure include an IMU that has at least one gyroscopic indicator of heading, at least one magnetometer indicator of heading, and a control system. The control system is configured to operate on the headings retrieved by the gyroscopic and magnetometer indicators of heading at the same (or very close to the same) time steps. At each time step, there is heading information from the gyroscopic indicator and separate heading information from the magnetometer indicator.

Another example embodiment of the present disclosure includes a method of determining heading from an IMU having at least one gyroscopic indicator of heading and at least one magnetometer of heading, which includes combining the gyroscopic and magnetometer indicators of heading output for a determined number ("x") of consecutive samples. Consecutive changes in the x samples are restricted in they are unexpected or impossible, and a prediction method is used to guess what the xth sample's value should have been based on the data collected. The prediction is combined for the xth sample value to the heading measured by the gyroscopic indicator of heading. The final heading, when taken and the steps' repeated use over a long period of time, results in reduced drift.

Another example method of the present disclosure includes reading an output from a gyroscopic indicator of heading and a magnetometer indicator of heading at similar time steps over many samples, to generate two sets of data (gyroscopic and magnetometer heading). Removing error as early as possible will improve the results of this process, so it is recommended to use fusion software to retrieve the gyroscopic indicator of heading and the magnetometer indicator of heading. At each time step, take the difference of the two sets of the data.

Figure 3A:
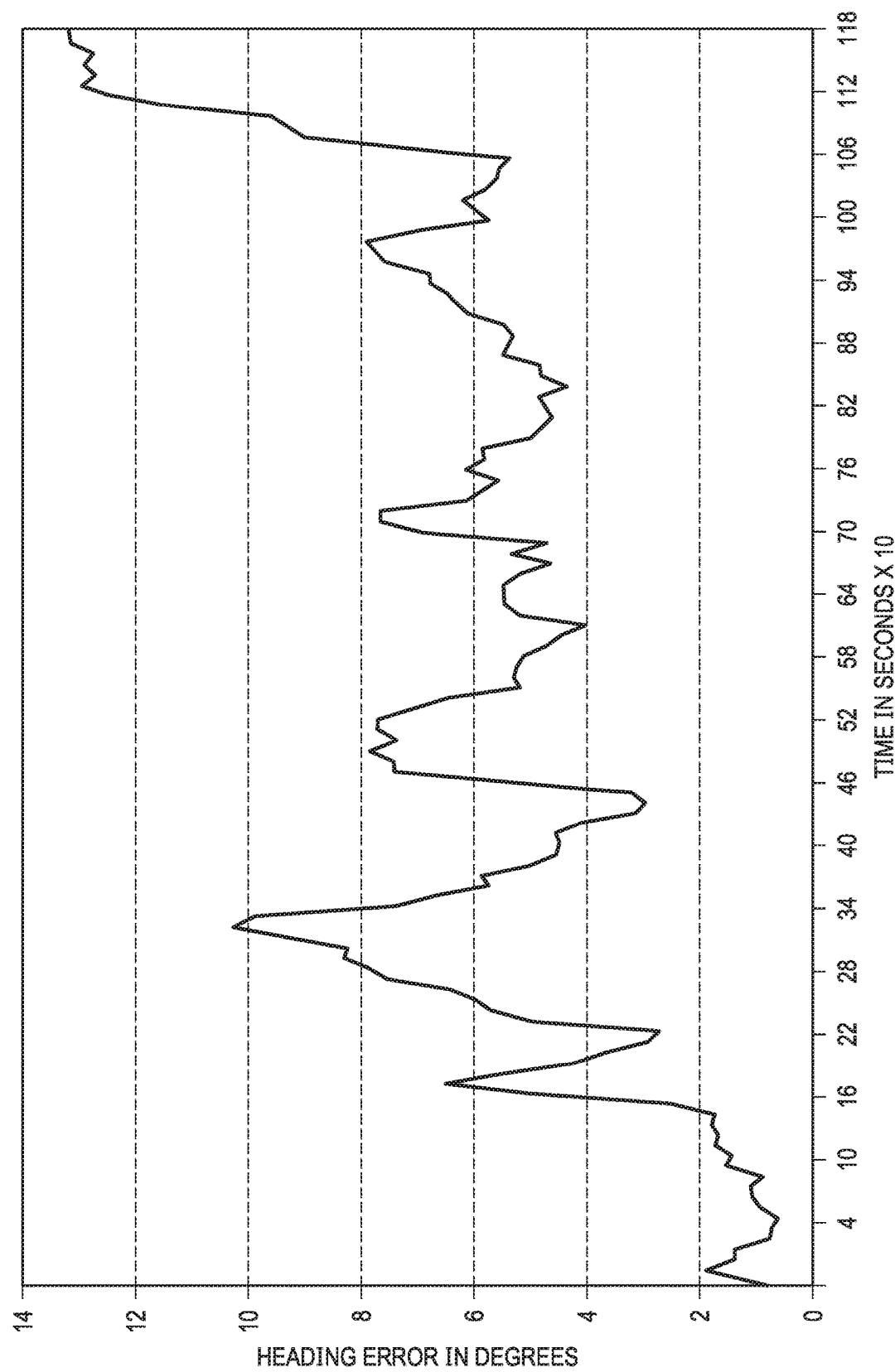
FIGS. 3A and 3B are graphs showing magnetometer heading minus gyroscopic heading, in accordance with the present disclosure.
Figure 3B:
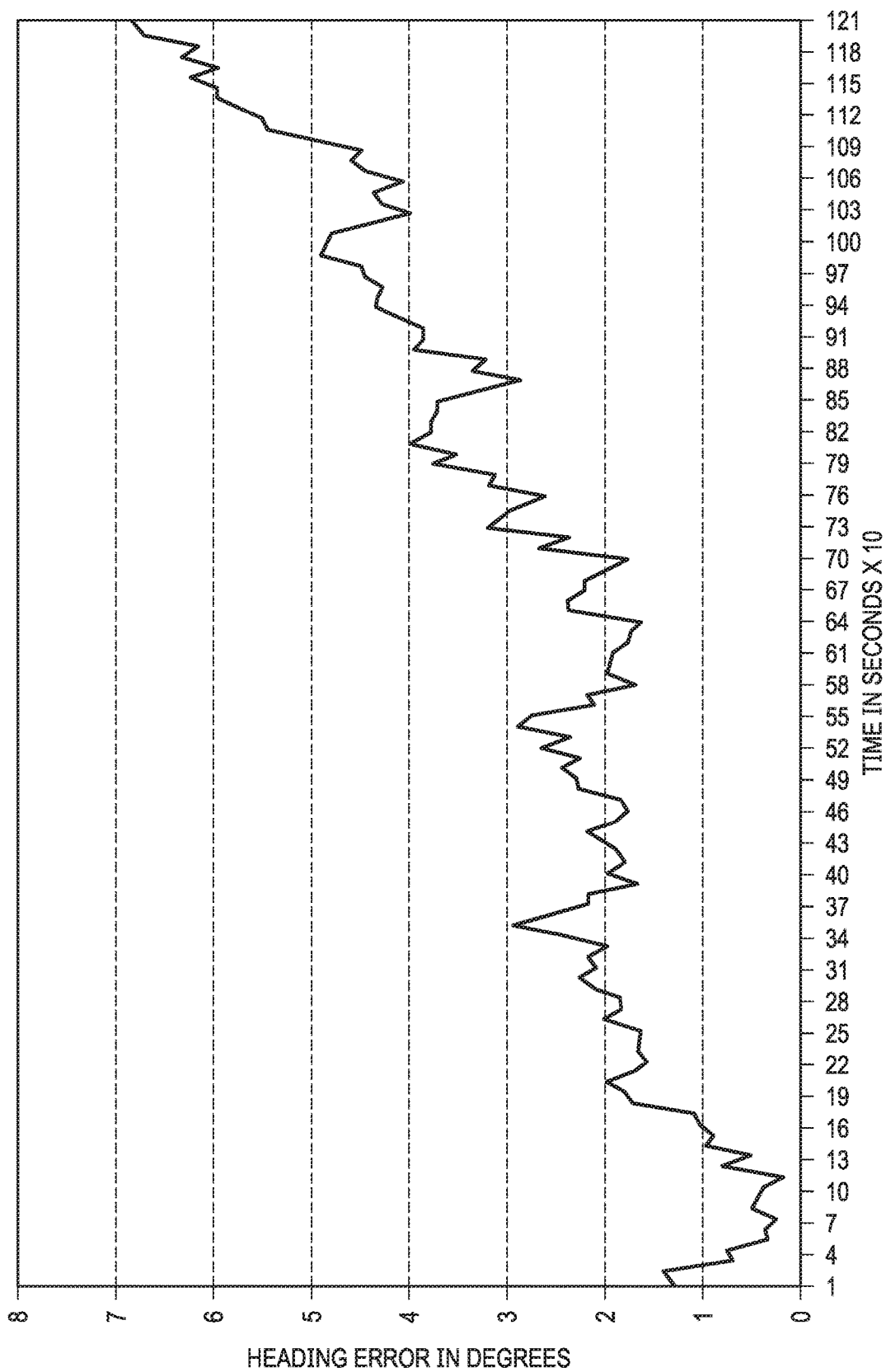

FIGS. 3A and 3B are graphs 300A and 300B showing magnetometer heading minus gyroscopic heading, in accordance with the present disclosure. The data in graph 300A can be processed to prevent unexpected changes from occurring. For example, the gyroscopic and magnetometer worst case drift and error measurements (see FIGS. 7A through 7D and the associated discussion) can be used to limit changes between two time steps. When the data from graph 300A is processed to ensure that no change greater than about 0.2° between two time samples (ten seconds) occurs, graph 300B is generated.

A time step for calculating drift can also be determined, as follows. Using the data from graph 300A, a one minute range (seven samples) can be used at a time. For the first six samples, there is not enough data, so the gyroscopic heading is used as the actual heading of the system. Starting at the seventh sample and for the rest of the samples, seven samples (including the sample at the current time stamp) are averaged to determine a drift value for that time stamp, and that drift value is subtracted from the gyroscopic heading at that time stamp to compute the reduced drift heading.

Figure 4A:
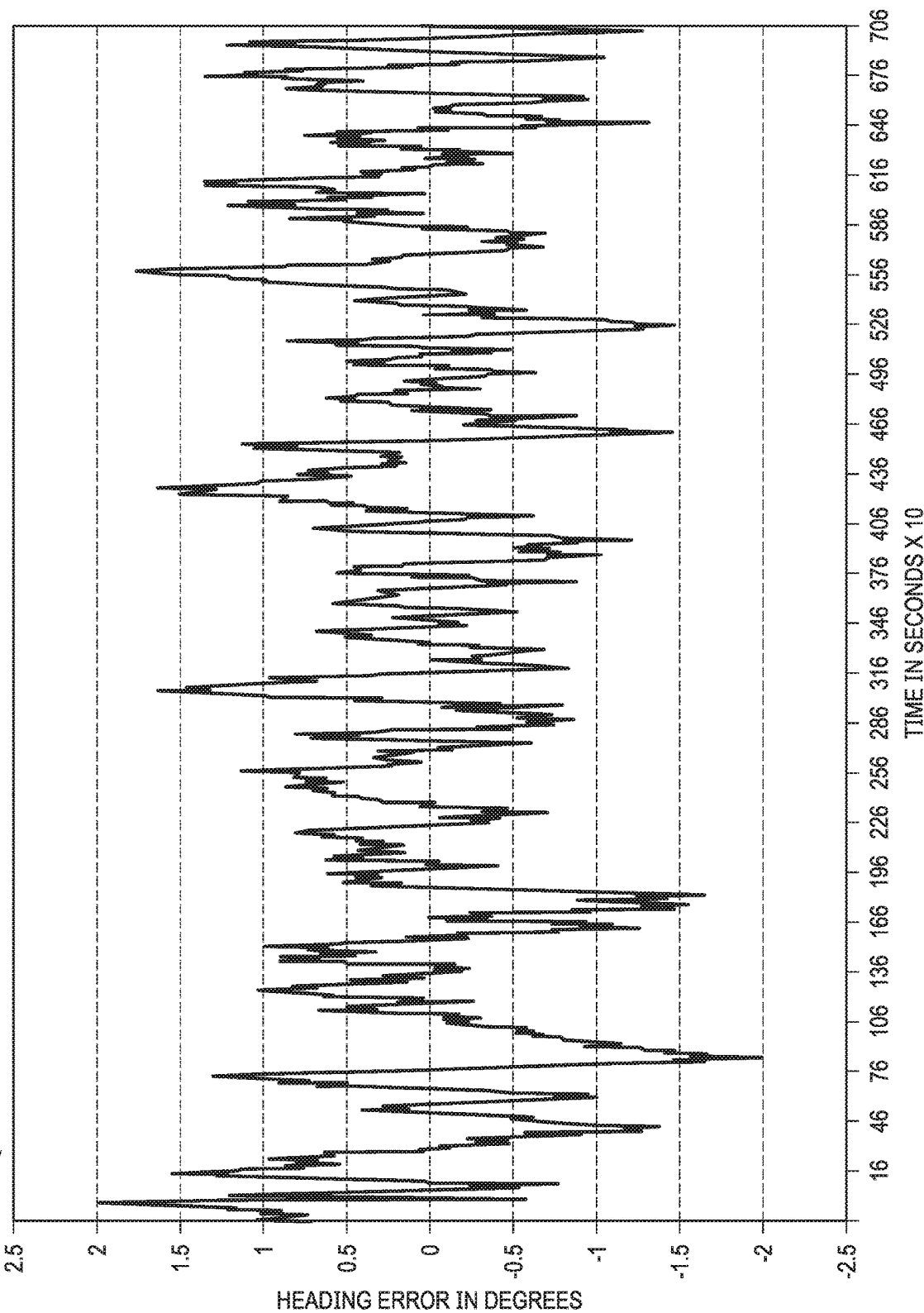
FIGS. 4A and 4B are graphs which use the present disclosure to reduce drift.
Figure 4B:
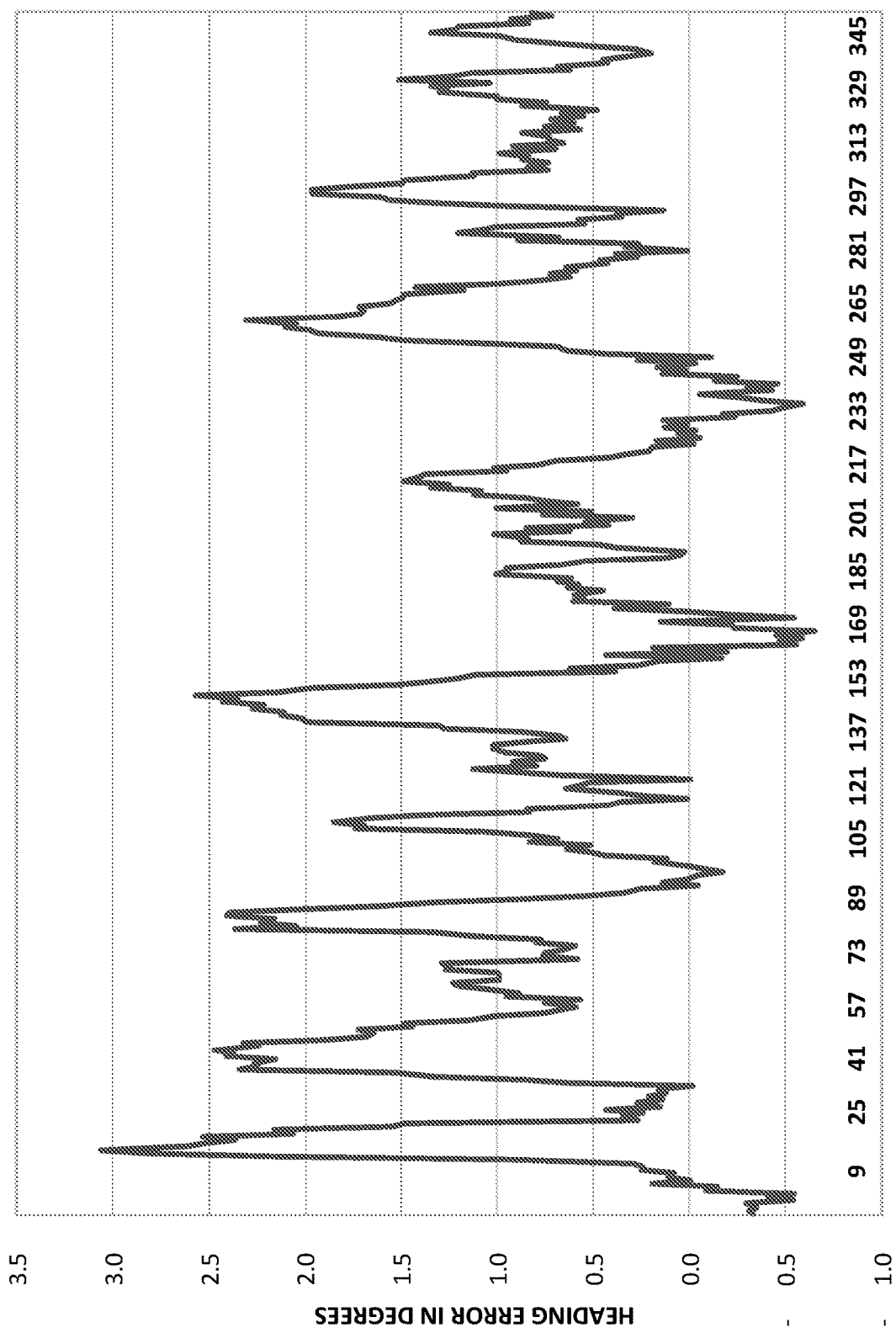

FIGS. 4A and 4B are graphs 400A and 400B, which use the present disclosure to reduce drift. The number of samples to take can be variable during this process, and the time step can also be independent, although the gyroscopic and magnetometer measurements should be taken at roughly the same time in order to get the best results.

Figure 5:
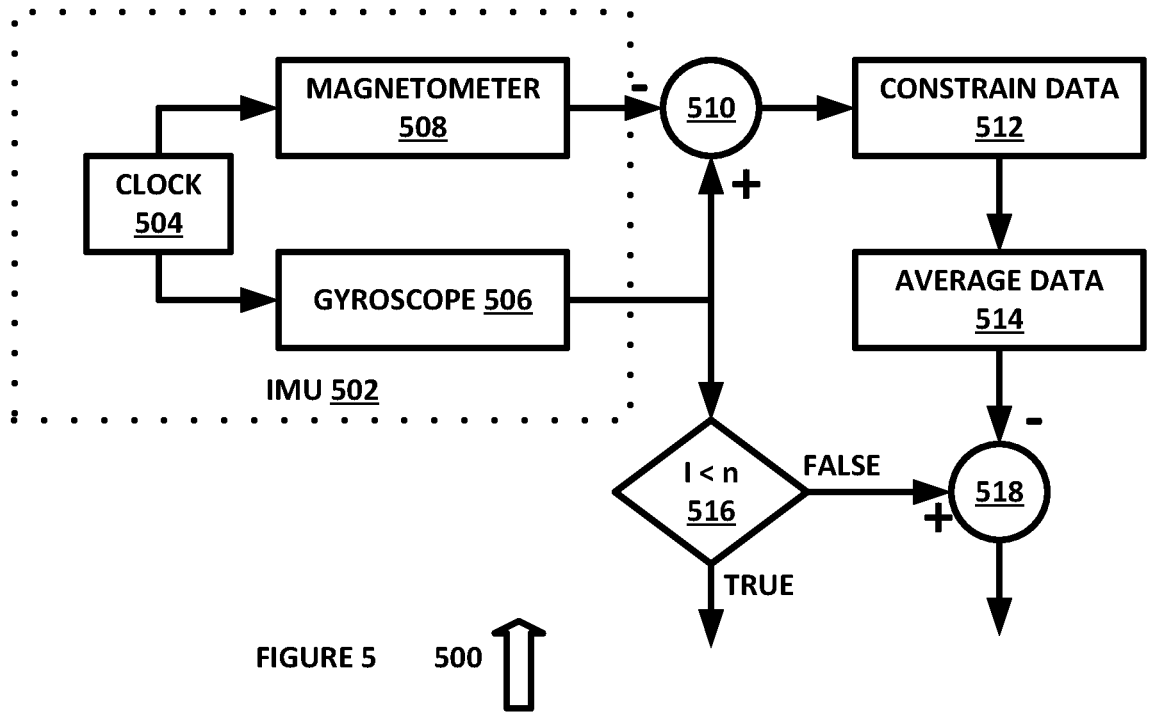
FIG. 5 is a diagram of a system in accordance with an example embodiment of the present disclosure.

FIG. 5 is a diagram of a system 500, in accordance with an example embodiment of the present disclosure. System 500 includes IMU 502, which further includes clock 504, gyroscope 506 and magnetometer 508, adders 510 and 518, constrain data system 512, average data system 514 and decision system 516, each of which can be implemented in hardware or a suitable combination of hardware and software.

IMU 502 can be used with a gyroscopic heading indicator from gyroscope 506 and a magnetometer heading indicator from magnetometer 508, which provide their outputs directly to adder 510 and decision system 516, to reduce drift. Gyroscope 506 and magnetometer 508 can receive a clock signal from clock 504 to reduce latency between the corresponding outputs. In addition, gyroscope 506 and magnetometer 508 do not have to be physically located in IMU 502, and two or more gyroscopes and magnetometers can be used to help reduce error. In another example embodiment, the outputs of gyroscope 506 and magnetometer 508 can be processed using fusion software before being provided to other components of system 500.

The measurement interval can be empirically determined, such as by performing measurements using the disclosed method with different measurement intervals, and using the interval that gets the best results for the gyroscope-magnetometer input to the system. The delay between consecutive heading readings from gyroscope 506 and magnetometer 508 and the measurement interval will determine how many samples need to be collected before drift is best reduced, in accordance with the present disclosure. The measurement interval can also or alternatively change over time, such that system 500 can be started with a first predetermined sampling interval, and that sampling interval can be increased or decreased until an optimal interval is determined that produces results with the lowest error.

For all of the samples in the interval, the magnetometer heading data from magnetometer 508 is subtracted from the gyroscopic heading data from gyroscope 506 at adder 510, to generate a value for each pair of samples over the interval. For each generated value, changes in the system are limited by constrain data system 512, and the known worst-case drift error and reading errors for gyroscope 506 and magnetometer 508 are used, to determine how these changes are limited. This limit can be implemented by identifying when two consecutive changes extend beyond the limit and then changing the value of the second value to fit the limit when the limit is violated. This process can be performed for each consecutive pair of values.

For the new values obtained across the interval, the average of the values is calculated by average data system 514, and that average is subtracted from the most recent gyroscopic heading measurement taken by adder 518, when it is determined by decision system 516 that the sample is not less than a predetermined value, to generate the heading measurement with reduced drift.

Figure 6:
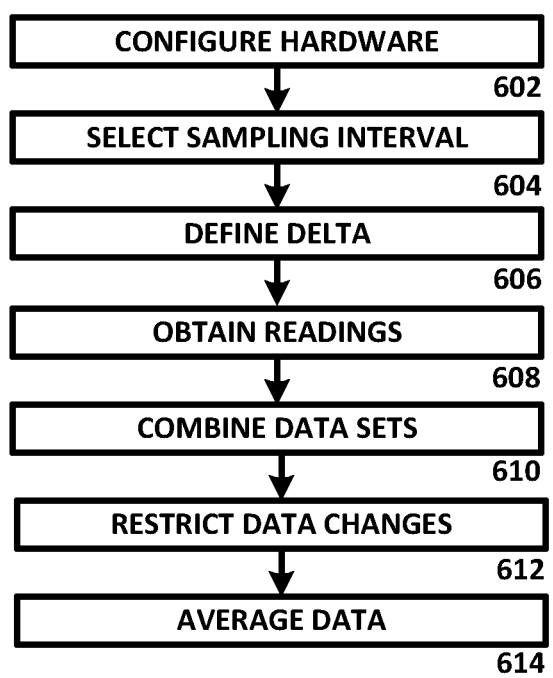
FIG. 6 is a diagram of algorithm in accordance with an example embodiment of the present disclosure.
Figure 6:
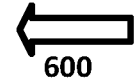
Figure 7B:
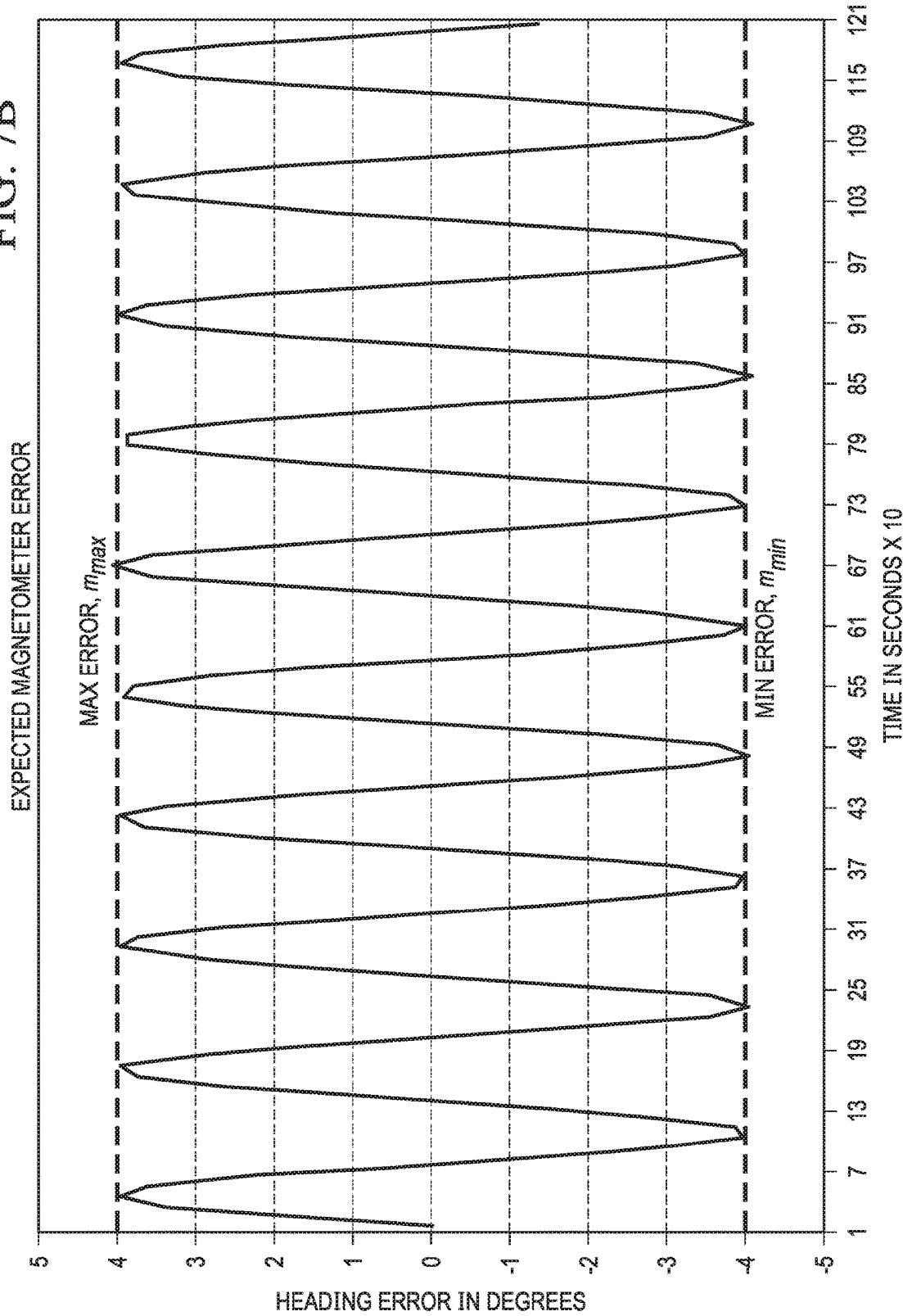
Figure 7D:
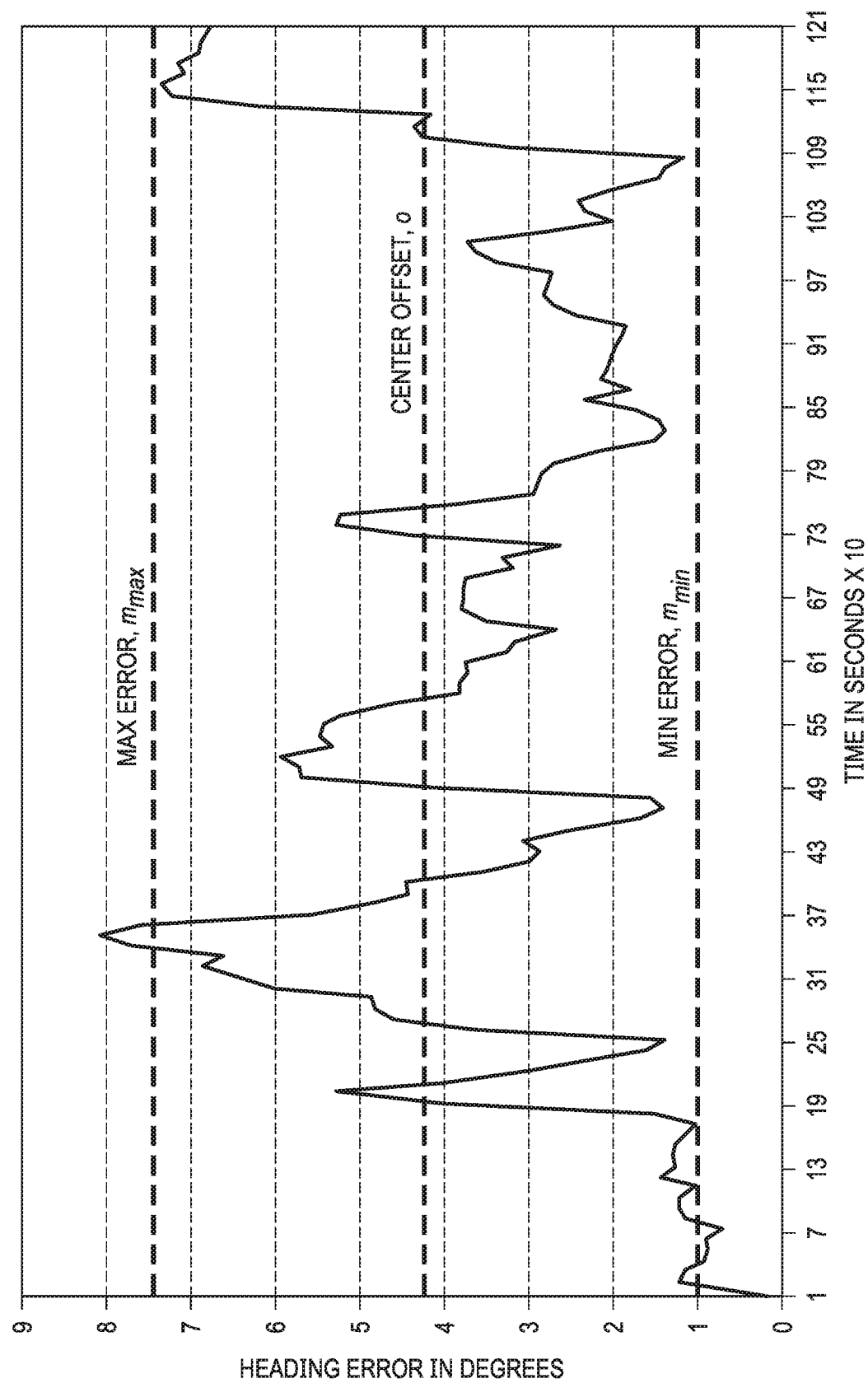

FIG. 6 is a diagram of algorithm 600, in accordance with an example embodiment of the present disclosure. Algorithm 600 can be implemented using one or more processors.

Algorithm 600 begins at 602, where a hardware system is configured to return gyroscopic and magnetometer dependent headings on the same clock cycle. In one example embodiment, data can be collected using a predetermined time delay, "d," and the time delay can be used to configure one or more gyroscopes and one or more magnetometers. The algorithm then proceeds to 604.

At 604, a known sampling interval, "t," is selected and used to set a sampling rate for the gyroscope and magnetometer. In one example embodiment, the sampling interval "t" can be variable, and any improvements identified by selecting different values for "t" can also or alternatively be identified by comparing the results for a first value of "t" to results for other values of "t," to determine an optimal value of "t" for the system. The algorithm then proceeds to 606.

At 606, a worst-case delta in heading error, "w," that will be allowed by the system over the time delay "d" is defined. This error "w" can be determined based on the measured sensor limitations, and can also be dynamically assigned as a function of selected sensors or for other suitable purposes. The algorithm then proceeds to 608.

At 608, a gyroscopic heading measurement, "$g_i$," and an associated magnetometer heading measurement, "$m_i$," is obtained, where i is the ith collected sample. In one example embodiment, there can be measurements ($g_i$, $g_{i+1}$ ... $g_{i+n}$) and ($m_i$, $m_{i+1}$ ... $m_{i+n}$) for all of the samples within the interval "t," or other suitable sampling protocols can also or alternatively be used. The algorithm then proceeds to 610.

At 610, the data sets are combined, such as by subtracting (($g_i-m_i$), ($g_{i+1}-m_{i+1}$) ... ($g_{i+n}-m_{i+n1}$)), to yield the set ($s_i$, $s_{i+1}$ ... $s_{i+n}$). The algorithm then proceeds to 612.

At 612, the data changes are restricted so as not to exceed w. If $|s_{k+1}-s_k|>|w|$, then $s_{k+1}=s_k\pm|w|$, in which case $s_{k+1}=s_k+|w|$ if $s_{k+1}>s_k$ is selected, and $s_{k+1}=s_k-|w|$ is selected otherwise. The algorithm then proceeds to 614.

At 614, the resulting data is averaged, such as by using the relationship $a_n=(s_i+s_{i+1}+ \ldots s_{i+n})/(n-i+1)$, or other suitable relationships. The heading, $g_{n-an}$ is used for the nth reported heading instead of the sensor values $g_n$ or $m_n$ for reduced drift.

FIGS. 7A through 7D are graphs 700A through 700D demonstrating the principles of the present disclosure. Graph 700A shows the expected drift in gyroscopic heading, and graph 700B shows the expected error in magnetometer heading, which are applied to the real-world data of graphs 100 and 200 to show the drift, "d," in graph 700C and a noticeable offset error, "o," in graph 700D respectively. The drift, "d," is dependent on time; while, the offset error, "o," is independent of time.

Two equations can be written representing real world data, where:

h(t) is the ideal heading with no error
A(t) is the reported gyroscopic heading
B(t) is the reported magnetometer heading
d(t) is the drift in gyroscopic heading
e1(t) is the gyroscopic measurement error independent of drift
e2(t) is the magnetometer measurement error independent of the offset error, "o:"

$$A(t)-h(t)=d(t)+e1(t)$$

$$B(t)-h(t)=o+e2(t)$$

$$A(t)-B(t)+o=d(t)+e1(t)-e2(t)$$

Because graph 100 is the graph for A(t)−h(t) and e1(t)−e2(t) is also an error centered around zero, like e1(t) or e2(t), the same graph will look similar to A(t)−B(t)+o. To help limit the offset error, "o," in the equation and to get closer results to A(t)−h(t), every two, adjacent samples of A(t)−B(t) are restricted based on known error for the sensors and system. The error can be measured, which greatly reduces the impact of "o" on the system:

$$\text{Limit}(A(t)-B(t))=d(t)-o+e1(t)-e2(t) A\ A(t)-h(t)$$

To approximate drift, d(t), using graph 100, a moving average is taken. Drift is therefore approximated by taking many consecutive samples of limit(A(t)−B(t)) and averaging the results. Drift can be approximated for any time sample of the system in this manner, resulting in headings with reduced drift when using A(t)−d(t) as the system heading instead of A(t) or B(t).

Figure 8:
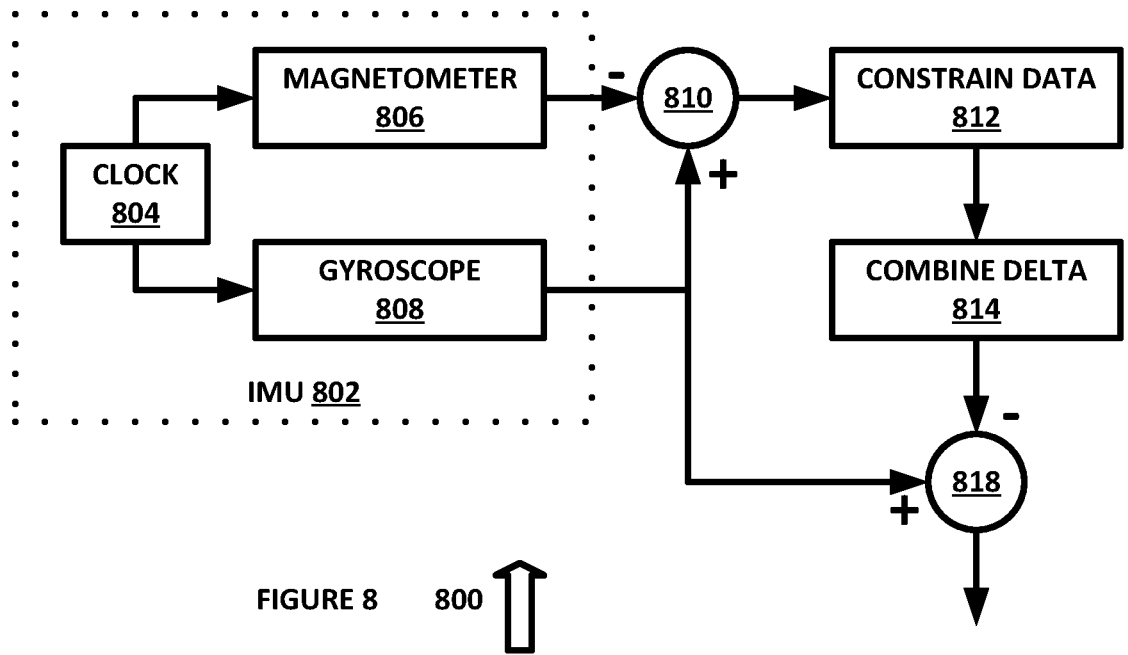
FIG. 8 is a diagram of a system in accordance with an example embodiment of the present disclosure.

FIG. 8 is a diagram of a system 800, in accordance with an example embodiment of the present disclosure. System 800 includes EMU 802, which further includes clock 804, gyroscope 808 and magnetometer 806, adders 810 and 818, constrain data system 812 and combine delta system 814, each of which can be implemented in hardware or a suitable combination of hardware and software.

In accordance with the present disclosure, gyroscope 808 can output a "drift heading" and magnetometer 806 can output a "large error heading", each of which can be obtained from a number of different sources. For example, while the process to remove drift from an IMU output is discussed, other readings that present drift can use the disclosed system and method, such as by supplying a "drift heading" and a second heading that approximates the heading without drift even if the error in the "large error heading" readings is not large. For example, the present disclosure can be used to determine clock drift, where a leader clock is the "large error heading" input and a member clock is the "drift heading" input. In this example, drift can be removed from the member clock, so the outputs of the leader and member clocks stay close together despite their hardware not tracking the exact same time. Also, the large error heading (i) does not need to come from a magnetometer and is only used in the present disclosure as an application example.

The operations performed on the input to the disclosed system do not have to be "drift heading" or "large error heading" signals, as discussed. The operation that is chosen can also or alternatively combine the two inputs in a meaningful way to constrain the data for better results. In system 800, the large error heading and drift heading data are combined, and a "delta" output from adder 810 can be associated with an error between the inputs. This configuration allows the IMU scenario to constrain "delta" knowing the IMU's precision levels for the magnetometer and gyroscope. Other suitable operations could be used instead of subtraction.

Another aspect of the invention is that the operations selected to find delta can be reversed when they are recombined for the output of the system. In system 800, subtraction was used on the input, so subtraction is used on the output. For example, division could be used on the input and again on the output if desired, although it is noted that this would change the meaning of "delta" within the system.

Constraining the "delta" values in system 800 is optional, and is not required to reduce drift; however, results are improved by including the step for an IMU, so it is discussed in the present disclosure. For example, the gyroscopic and magnetometer worst case drift and error measurements can be used to limit changes between two time steps. When the data from graph 300A is processed to ensure that no change greater than about 0.2° between two time samples (ten seconds) occurs, graph 300B is generated. Also, the data can be manipulated in other ways to reduce error at suitable locations in system 800 to achieve reduced drift. For best results, the inputs are not modified after they are combined to form "delta" and before they are recombined to determine the output of the system. Alternatively, the values can be constrained out of system 800 before data is input to the system or after the output is processed.

System 800 includes clock 804 driving magnetometer 806 and gyroscope 808 to generate readings, but other suitable configurations can also or alternatively be used. For example, a different clock can be used for the gyroscope and magnetometer, or multiple magnetometers can drift the magnetometer input into the system. The closer the readings of magnetometer 806 and gyroscope 808 are to the same time, the greater the precision can be in a drift removal process.

Combine delta 814 of system 800 can use different delta values to find one optimal value. For example, a moving average can be used to represent averaging a known number of these delta values, which can change over time. The moving average is discussed in the present disclosure, but other suitable processes can also or alternatively be used to combine the data into meaningful representations of a trend (what moving average does). For example, there are several ways to generate a trend line from the "delta" values, and the generated trend line can be used to find the output of combine delta 814, which is subtracted from the original "drift heading" input.

The present disclosure can be implemented in computer programs. Traditionally, a computer program consists of a finite sequence of computational instructions or program instructions. It will be appreciated that a programmable apparatus (i.e., computing device) can receive such a computer program and, by processing the computational instruction thereof, produce a further technical effect.

A programmable apparatus can include one of more microprocessors, microcontrollers, embedded microcontrollers, programmable digital signal processors, programmable devices, programmable gate arrays, programmable array logic, memory devices, application specific integrated circuits, or the like, which can be suitably employed or configured to process computer program instructions, execute computer logic, store computer data, and so on. Throughout this disclosure and elsewhere a computer can include any and all suitable combinations of a special-purpose computer, programmable data processing apparatus, processor, processor architecture, and so on.

A computer can include a computer-readable storage medium and this medium can be internal or external, removable and replaceable, or fixed. It will also be understood that a computer can include a Basic Input/Output System (BIOS), firmware, an operating system, a database, or the like that can include, interface with, or support the software and hardware described herein.

Embodiments of the systems as described herein are not limited to applications involving conventional computer programs or programmable apparatuses that run them. It is contemplated, for example, that embodiments of the invention as claimed herein could include an optical computer, quantum computer, analog computer, or the like.

Regardless of the type of computer program or computer involved, a computer program can be loaded onto a computer to produce a particular machine that can perform any and all of the depicted functions. This particular machine provides a means for carrying out any and all of the depicted functions.

Any combination of one or more computer readable medium(s) can be utilized. The computer readable medium can be a computer readable signal medium or a computer readable storage medium. A computer readable storage medium can be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium can be any tangible medium that can contain, or store a program for use by or in connection with an instruction execution system, apparatus, or device.

Computer program instructions can be stored in a computer-readable memory capable of directing a computer or other programmable data processing apparatus to function in a particular manner. The instructions stored in the computer-readable memory constitute an article of manufacture including computer-readable instructions for implementing any and all of the depicted functions.

A computer readable signal medium can include a propagated data signal with computer readable program code embodied therein, for example, in baseband or as part of a carrier wave. Such a propagated signal can take any of a variety of forms, including, but not limited to, electromagnetic, optical, or any suitable combination thereof. A computer readable signal medium can be any computer readable medium that is not a computer readable storage medium and that can communicate, propagate, or transport a program for use by or in connection with an instruction execution system, apparatus, or device.

Program code embodied on a computer readable medium can be transmitted using any appropriate medium, including but not limited to wireless, wireline, optical fiber cable, RF, etc., or any suitable combination of the foregoing.

The elements depicted in flowchart illustrations and block diagrams throughout the figures imply logical boundaries between the elements. However, according to the software or hardware engineering practices, the depicted elements and the functions thereof can be implemented as parts of a monolithic software structure, as standalone software modules, or as modules that employ external routines, code, services, and so forth, or any combination of these. All such implementations are within the scope of the present disclosure.

In view of the foregoing, it will now be appreciated that elements of the block diagrams and flowchart illustrations support combinations of means for performing the specified functions, combinations of steps for performing the specified functions, program instruction means for performing the specified functions, and so on.

It will be appreciated that computer program instructions can include computer executable code. A variety of languages for expressing computer program instructions are possible, including without limitation C, C++, Java, JavaScript, assembly language, Lisp, HTML, Perl, and so on. Such languages can include assembly languages, hardware description languages, database programming languages, functional programming languages, imperative programming languages, and so on. In some embodiments, computer program instructions can be stored, compiled, or interpreted to run on a computer, a programmable data processing apparatus, a heterogeneous combination of processors or processor architectures, and so on. Without limitation, embodiments of the system as described herein can take the form of web-based computer software, which includes client/server software, software-as-a-service, peer-to-peer software, or the like.

In some embodiments, a computer enables execution of computer program instructions including multiple programs or threads. The multiple programs or threads can be processed more or less simultaneously to enhance utilization of the processor and to facilitate substantially simultaneous functions. By way of implementation, any and all methods, program codes, program instructions, and the like described herein can be implemented in one or more thread. The thread can spawn other threads, which can themselves have assigned priorities associated with them. In some embodiments, a computer can process these threads based on priority or any other order based on instructions provided in the program code.

Unless explicitly stated or otherwise clear from the context, the verbs "execute" and "process" are used interchangeably to indicate execute, process, interpret, compile, assemble, link, load, any and all combinations of the foregoing, or the like. Therefore, embodiments that execute or process computer program instructions, computer-executable code, or the like can suitably act upon the instructions or code in any and all of the ways just described.

The functions and operations presented herein are not inherently related to any particular computer or other apparatus. It is possible to modify or customize general-purpose systems to be used with programs in accordance with the teachings herein, or it might prove convenient to construct more specialized apparatus to perform the required method steps. The required structure for a variety of these systems will be apparent to those of skill in the art, along with equivalent variations. In addition, embodiments of the invention are not described with reference to any particular programming language. It is appreciated that a variety of programming languages can be used to implement the present teachings as described herein, and any references to specific languages are provided for disclosure of enablement and best mode of embodiments of the invention. Embodiments of the invention are well suited to a wide variety of computer network systems over numerous topologies. Within this field, the configuration and management of large networks include storage devices and computers that are communicatively coupled to dissimilar computers and storage devices over a network, such as the Internet.

Throughout this disclosure and elsewhere, block diagrams and flowchart illustrations depict methods, apparatuses (i.e., systems), and computer program products. Each element of the block diagrams and flowchart illustrations, as well as each respective combination of elements in the block diagrams and flowchart illustrations, illustrates a function of the methods, apparatuses, and computer program products. Any and all such functions ("depicted functions") can be implemented by computer program instructions; by special-purpose, hardware-based computer systems; by combinations of special purpose hardware and computer instructions; by combinations of general purpose hardware specialized through computer instructions; and so on—any and all of which can be generally referred to herein as a "circuit," "module," or "system."

While the foregoing drawings and description set forth functional aspects of the disclosed systems, no particular arrangement of software for implementing these functional aspects should be inferred from the descriptions unless explicitly stated or otherwise clear from the context.

Each element in flowchart illustrations can depict a step, or a group of steps, of a computer-implemented method. Further, each step can contain one or more sub-steps. For the purpose of illustration, these steps (as well as any and all other steps identified and described above) are presented in an order. It will be understood that an embodiment can contain an alternate order of the steps adapted to a particular application of a technique disclosed herein. All such variations and modifications are intended to fall within the scope of this disclosure. The depiction and description of steps in any particular order is not intended to exclude embodiments having the steps in a different order, unless required by a particular application, explicitly stated, or otherwise clear from the context.

The functions, systems and methods herein described can be utilized and presented in a multitude of languages. Individual systems can be presented in one or more languages and the language can be changed with ease at any point in the process or methods described above. One of ordinary skill in the art would appreciate that there are numerous languages the system could be provided in, and embodiments of the present invention are contemplated for use with any language.

While multiple embodiments are disclosed, still other embodiments of the present invention will become apparent to those skilled in the art from this detailed description. The invention is capable of myriad modifications in various obvious aspects, all without departing from the spirit and scope of the present invention. Accordingly, the drawings and descriptions are to be regarded as illustrative in nature and not restrictive.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. As used herein, phrases such as "between X and Y" and "between about X and Y" should be interpreted to include X and Y. As used herein, phrases such as "between about X and Y" mean "between about X and about Y." As used herein, phrases such as "from about X to Y" mean "from about X to about Y."

As used herein, "hardware" can include a combination of discrete components, an integrated circuit, an application-specific integrated circuit, a field programmable gate array, or other suitable hardware. As used herein, "software" can include one or more objects, agents, threads, lines of code, subroutines, separate software applications, two or more lines of code or other suitable software structures operating in two or more software applications, on one or more processors (where a processor includes one or more microcomputers or other suitable data processing units, memory devices, input-output devices, displays, data input devices such as a keyboard or a mouse, peripherals such as printers and speakers, associated drivers, control cards, power sources, network devices, docking station devices, or other suitable devices operating under control of software systems in conjunction with the processor or other devices), or other suitable software structures. In one exemplary embodiment, software can include one or more lines of code or other suitable software structures operating in a general purpose software application, such as an operating system, and one or more lines of code or other suitable software structures operating in a specific purpose software application. As used herein, the term "couple" and its cognate terms, such as "couples" and "coupled," can include a physical connection (such as a copper conductor), a virtual connection (such as through randomly assigned memory locations of a data memory device), a logical connection (such as through logical gates of a semiconducting device), other suitable connections, or a suitable combination of such connections. The term "data" can refer to a suitable structure for using, conveying or storing data, such as a data field, a data buffer, a data message having the data value and sender/receiver address data, a control message having the data value and one or more operators that cause the receiving system or component to perform a function using the data, or other suitable hardware or software components for the electronic processing of data.

In general, a software system is a system that operates on a processor to perform predetermined functions in response to predetermined data fields. For example, a system can be defined by the function it performs and the data fields that it performs the function on. As used herein, a NAME system, where NAME is typically the name of the general function that is performed by the system, refers to a software system that is configured to operate on a processor and to perform the disclosed function on the disclosed data fields. Unless a specific algorithm is disclosed, then any suitable algorithm that would be known to one of skill in the art for performing the function using the associated data fields is contemplated as falling within the scope of the disclosure. For example, a message system that generates a message that includes a sender address field, a recipient address field and a message field would encompass software operating on a processor that can obtain the sender address field, recipient address field and message field from a suitable system or device of the processor, such as a buffer device or buffer system, can assemble the sender address field, recipient address field and message field into a suitable electronic message format (such as an electronic mail message, a TCP/IP message or any other suitable message format that has a sender address field, a recipient address field and message field), and can transmit the electronic message using electronic messaging systems and devices of the processor over a communications medium, such as a network. One of ordinary skill in the art would be able to provide the specific coding for a specific application based on the foregoing disclosure, which is intended to set forth exemplary embodiments of the present disclosure, and not to provide a tutorial for someone having less than ordinary skill in the art, such as someone who is unfamiliar with programming or processors in a suitable programming language. A specific algorithm for performing a function can be provided in a flow chart form or in other suitable formats, where the data fields and associated functions can be set forth in an exemplary order of operations, where the order can be rearranged as suitable and is not intended to be limiting unless explicitly stated to be limiting.

It should be emphasized that the above-described embodiments are merely examples of possible implementations. Many variations and modifications may be made to the above-described embodiments without departing from the principles of the present disclosure. All such modifications and variations are intended to be included herein within the scope of this disclosure and protected by the following claims.

What is claimed is:

1. A system, comprising:
    a clock generating a timing signal;
    a magnetometer coupled to the clock and configured to receive the timing signal and to generate first heading data;
    a gyroscope coupled to the clock and configured to receive the timing signal and to generate second heading data;
    a first adder coupled to the magnetometer and gyroscope and configured to determine a difference signal as a function of the first heading data and the second heading data;
    a combine delta system coupled to the first adder and configured to combine two or more of the difference signals to generate a combined delta signal; and
    a second adder coupled to the gyroscope and the combine delta system and configured to add the combined delta signal to the second heading data.

2. The system of claim 1 wherein the magnetometer comprises a plurality of magnetometers configured to generate the first heading data.

3. The system of claim 1 wherein the gyroscope comprises a plurality of gyroscopes configured to generate the second heading data.

4. The system of claim 1 further comprising a constrain data system configured to apply a limit that is associated with a predetermined application.

5. The system of claim 1 wherein the first heading data comprises a plurality of discrete heading data values, each associated with a first specific time increment of the timing signal.

6. The system of claim 5 wherein the second heading data comprises a plurality of discrete heading data values, each associated with a second specific time increment of the timing signal.

7. The system of claim 6 wherein the first specific time increment is within a predetermined value of the second specific time increment.

8. A method, comprising:
    generating a timing signal with a clock;
    receiving the timing signal at a magnetometer and generating first heading data;
    receiving the timing signal at a gyroscope and generating second heading data;
    determining a difference signal using a first adder as a function of the first heading data and the second heading data;
    combining two or more of the difference signals using a combine delta system to generate a combined delta signal; and
    adding the combined delta signal to the second heading data using a second adder.

9. The method of claim 8 wherein receiving the timing signal at the magnetometer and generating the first heading data comprises receiving the timing signal at a plurality of magnetometers and generating the first heading data using the plurality of magnetometers.

10. The method of claim 8 wherein receiving the timing signal at the gyroscope and generating the second heading data comprises receiving the timing signal at a plurality of gyroscope and generating the first heading data using the plurality of gyroscope.

11. The method of claim 8 further comprising applying the limit to the difference signal using a constrain data system and selecting the limit as a function of a predetermined application.

12. The method of claim 8 wherein generating the first heading data comprises generating a plurality of discrete heading data values, each associated with a first specific time increment of the timing signal.

13. The method of claim 12 wherein generating the second heading data comprises generating a plurality of discrete heading data values, each associated with a second specific time increment of the timing signal.

14. The method of claim 13 wherein the first specific time increment is within a predetermined value of the second specific time increment.

15. A system, comprising:
    a clock generating a timing signal;
    a magnetometer coupled to the clock and configured to receive the timing signal and to generate first heading data;
    a gyroscope coupled to the clock and configured to receive the timing signal and to generate second heading data;
    means for determining a difference signal as a function of the first heading data and the second heading data;
    means for applying a limit to the difference signal;
    means for combining two or more of the constrained data values to generate a combined delta signal; and
    means for adding the combined delta signal to the second heading data.

16. The system of claim 15 wherein the magnetometer comprises a plurality of magnetometers configured to generate the first heading data.

17. The system of claim 15 wherein the gyroscope comprises a plurality of gyroscopes configured to generate the second heading data.

18. The system of claim 15 wherein the constrain data system applies a limit that is associated with a predetermined application.

19. The system of claim 15 wherein the first heading data comprises a plurality of discrete heading data values, each associated with a first specific time increment of the timing signal.

20. The system of claim 19 wherein the second heading data comprises a plurality of discrete heading data values, each associated with a second specific time increment of the timing signal.

* * * * *